United States Patent
Lin et al.

(10) Patent No.: US 12,272,621 B2
(45) Date of Patent: Apr. 8, 2025

(54) BURIED CONDUCTIVE STRUCTURE IN SEMICONDUCTOR SUBSTRATE

(71) Applicant: Taiwan Semiconductor Manufacturing Company, Ltd., Hsinchu (TW)

(72) Inventors: Kan-Ju Lin, Kaohsiung (TW); Lin-Yu Huang, Hsinchu (TW); Min-Hsuan Lu, Hsinchu (TW); Wei-Yip Loh, Hsinchu (TW); Hong-Mao Lee, Hsinchu (TW); Harry Chien, Chandler, AZ (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 300 days.

(21) Appl. No.: 17/807,476

(22) Filed: Jun. 17, 2022

(65) Prior Publication Data

US 2023/0411242 A1    Dec. 21, 2023

(51) Int. Cl.
| | |
|---|---|
| *H01L 23/48* | (2006.01) |
| *H01L 21/768* | (2006.01) |
| *H01L 29/40* | (2006.01) |
| *H01L 29/417* | (2006.01) |
| *H01L 29/423* | (2006.01) |

(Continued)

(52) U.S. Cl.
CPC ...... *H01L 23/481* (2013.01); *H01L 21/76898* (2013.01); *H01L 29/401* (2013.01); *H01L 29/41733* (2013.01); *H01L 29/0665* (2013.01); *H01L 29/42392* (2013.01); *H01L 29/45* (2013.01); *H01L 29/456* (2013.01); *H01L 29/78696* (2013.01)

(58) Field of Classification Search
CPC ............. H01L 21/76898; H01L 23/481; H01L 29/401; H01L 29/41733; H01L 29/0665; H01L 29/42392; H01L 29/45; H01L 29/456; H01L 29/78696
See application file for complete search history.

(56) References Cited

U.S. PATENT DOCUMENTS

2016/0005824 A1   1/2016  Lin et al.
2017/0365604 A1* 12/2017  Suh ................. H01L 21/823878
(Continued)

FOREIGN PATENT DOCUMENTS

TW         201603187 A     1/2016

*Primary Examiner* — Timor Karimy
(74) *Attorney, Agent, or Firm* — Sterne, Kessler, Goldstein & Fox P.L.L.C.

(57) ABSTRACT

The present disclosure describes a buried conductive structure in a semiconductor substrate and a method for forming the structure. The structure includes an epitaxial region disposed on a substrate and adjacent to a nanostructured gate layer and a nanostructured channel layer, a first silicide layer disposed within a top portion of the epitaxial region, and a first conductive structure disposed on a top surface of the first silicide layer. The structure further includes a second silicide layer disposed within a bottom portion of the epitaxial region and a second conductive structure disposed on a bottom surface of the second silicide layer and traversing through the substrate, where the second conductive structure includes a first metal layer in contact with the second silicide layer and a second metal layer in contact with the first metal layer.

20 Claims, 12 Drawing Sheets

(51) Int. Cl.
*H01L 29/786* (2006.01)
*H01L 29/06* (2006.01)
*H01L 29/45* (2006.01)

(56) References Cited

U.S. PATENT DOCUMENTS

2018/0166551 A1    6/2018   Ching et al.
2020/0350205 A1   11/2020   Yin et al.
2022/0208967 A1*   6/2022   Ko ..................... H01L 29/0653

* cited by examiner

BURIED CONDUCTIVE STRUCTURE IN SEMICONDUCTOR SUBSTRATE

BACKGROUND

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around field-effect transistors (GAAFETs) and fin field-effect transistors (finFETs). Interconnect structures can be formed on the GAAFETs and the finFETs to electrically couple the transistors to other components in the integrated circuit (IC).

BRIEF DESCRIPTION OF THE DRAWINGS

Aspects of the present disclosure are best understood from the following detailed description when read with the accompanying figures.

DETAILED DESCRIPTION

Figure 1:
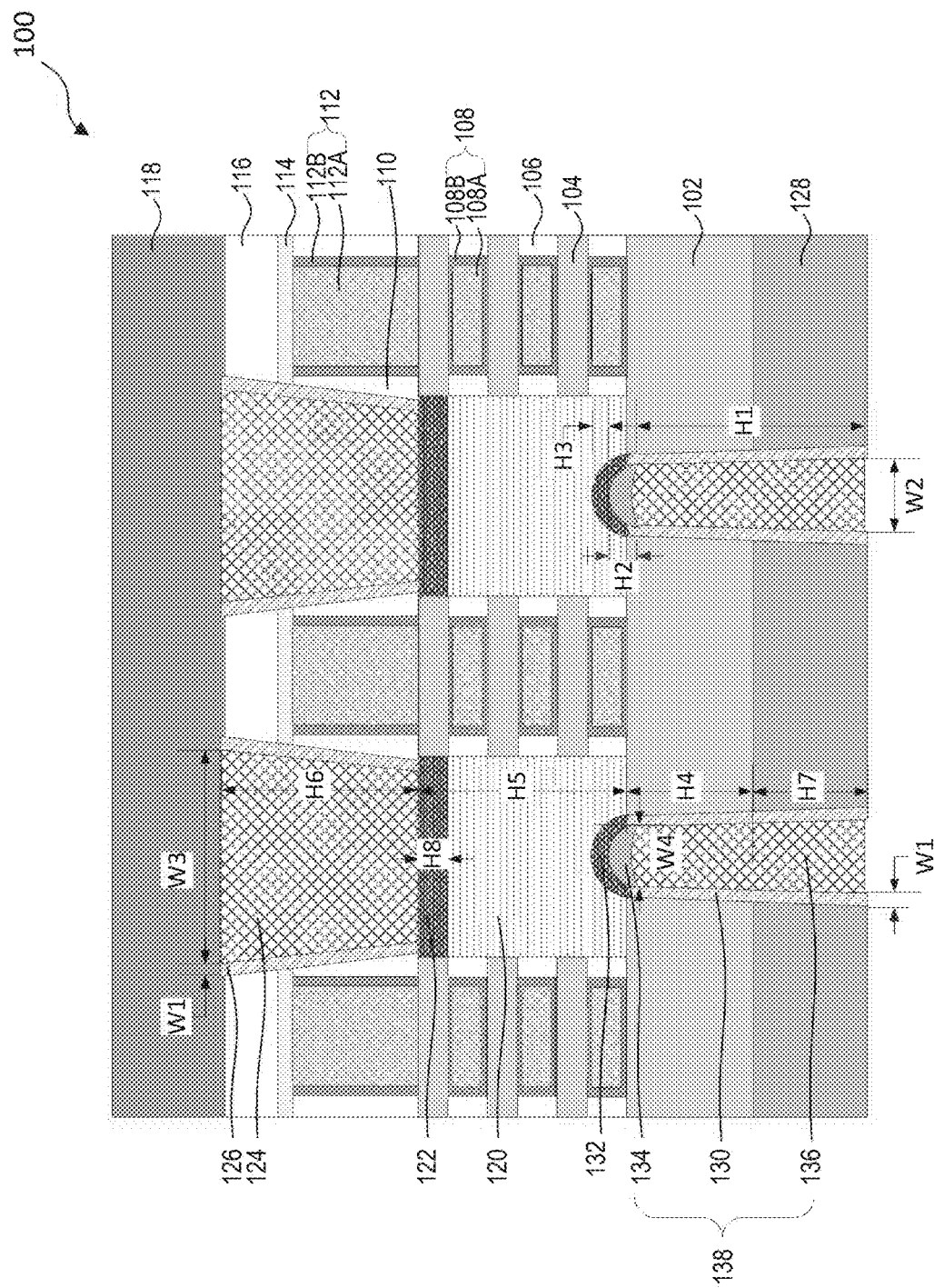
FIG. 1 illustrates a cross-sectional view of a semiconductor device with buried conductive structures in a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1 and 3-12 with the same annotations applies to each other, unless mentioned otherwise.

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around field-effect transistors (GAAFETs) and fin field-effect transistors (finFETs). In finFETs, fin structures can be formed on a substrate. In GAAFETs, fin structures can be formed on a substrate, nanostructured gate layers can be formed on the fin structures, and nanostructured channel layers can be formed on the nanostructured gate layers. In both finFETs and GAAFETs, gate structures can be formed on a first portion of the fin structures and source/drain (S/D) regions can be formed on a second portion of the fin structures. Top silicide layers can be formed within a top portion of the S/D regions. S/D contact structures can be formed on the top silicide layers. Gate contact structures can be formed on the gate structures. Interconnect structures can be formed on the S/D contact structures and the gate contact structures. The interconnect structures can electrically couple the S/D contact structures and the gate contact structures to metal vias and metal lines of the interconnect structures.

To reduce the size of the interconnect structures, buried conductive structures, such as buried power rails, can be formed in the substrate and below the S/D regions. The buried conductive structures can reduce the total number of layers of the interconnect structures because electrical coupling functions can be achieved by the buried conductive structures. Bottom silicide layers can be formed within a bottom portion of the S/D regions. To prevent the bottom silicide layers from being oxidized, barrier layers can be formed below the bottom silicide layers. Buried conductive structure liners and metal fill layers can be formed below the barrier layers. The barrier layers can be formed by nitriding the bottom silicide layers with a nitrogen-based plasma process. The nitrogen-based plasma process can convert a portion of the bottom silicide layers to the barrier layers. Consequently, the thickness of the bottom silicide layers is reduced. The nitrogen-based plasma process can also remove portions of the bottom silicide layers by bombardment, further reducing the thickness of the bottom silicide layers. Because the thickness of the bottom silicide layers is reduced, the resistance of the buried conductive structures increases and the performance of the semiconductor devices can be reduced.

The present disclosure provides an example semiconductor device with buried conductive structures with reduced resistance and an example method for fabricating the same. Metal capping layers can be formed below the bottom silicide layers to prevent the bottom silicide layers from being oxidized. Buried conductive structure liners and metal fill layers can be formed below the metal capping layers. The metal capping layers can be formed by an atomic layer deposition (ALD) process or a chemical vapor deposition (CVD) process. Because the metal capping layers are deposited below the bottom silicide layers, there can be no conversion of the bottom silicide layers. Because the metal capping layers are formed without a plasma process, there can also be no bombardment that can remove portions of the bottom silicide layers. Consequently, the bottom silicide layers can retain their thickness. Because the thickness of the bottom silicide layers is retained, the resistance of the buried conductive structures can be low and the performance of the semiconductor devices can be increased. In some embodiments, the metal capping layers can function as seed layers to facilitate the formation of the metal fill layers in a bottom-up manner. In some embodiments, the metal capping layers can function as glue layers to improve adhesion of the metal fill layers.

FIG. 1 illustrates a cross-sectional view of a semiconductor device 100 with buried conductive structures 138, according to some embodiments. Semiconductor device 100 can include a substrate 102, nanostructured channel layers 104, inner spacers 106, nanostructured gate layers 108, spacers 110, gate structures 112, etch stop layers (ESLs) 114, interlayer dielectric (ILD) layers 116, middle-end-of-the-line (MEOL) and back-end-of-the-line (BEOL) structures 118, S/D regions 120, top silicide layers 122, S/D contact structures 124, S/D contact structure liners 126, a hardmask layer 128, buried conductive structure liners 130, bottom silicide layers 132, metal capping layers 134, and metal fill layers 136. In some embodiments, semiconductor device 100 can include between about 2 and about 6 alternating nanostructured channel layers 104 and nanostructured gate layers 108. In some embodiments, semiconductor device 100 can be a finFET that does not include nanostructured channel layers 104, inner spacers 106, or nanostructured gate layers 108.

Substrate 102 can be a semiconductor material, such as silicon (Si), germanium (Ge), silicon germanium (SiGe), a silicon-on-insulator (SOI) structure, and combinations thereof. Further, substrate 102 can be doped with p-type dopants, such as boron (B), indium (In), aluminum (Al), and gallium (Ga), or n-type dopants, such as phosphorous (P) and arsenic (As). Substrate 102 can have a thickness H4 between about 20 nm and about 50 nm, between about 15 nm and about 80 nm, and between about 10 nm and about 100 nm.

Nanostructured channel layers 104 can be disposed on substrate 102 and interposed between adjacent nanostructured gate layers 108. Nanostructured channel layers 104 can be a semiconductor material. In some embodiments, nanostructured channel layers 104 can have the same semiconductor material as substrate 102. For example, nanostructured channel layers 104 can include Si. In some embodiments, nanostructured channel layers 104 can have the same crystalline orientation as that of substrate 102.

Nanostructured gate layers 108 can be disposed on substrate 102 and interposed between adjacent nanostructured channel layers 104. Gate structures 112 can be disposed on nanostructured gate layers 108 and nanostructured channel layers 104. Gate structures 112 and nanostructured gate layers 108 can include a multi-layered structure. Gate structures 112 and nanostructured gate layers 108 can include gate dielectric layers 112B and 108B. In some embodiments, gate dielectric layers 112B and 108B can include an insulating material, such as silicon oxide ($SiO_x$), silicon nitride (SiN), silicon carbon nitride (SiCN), silicon oxycarbon nitride (SiOCN), germanium oxide ($GeO_x$), silicon germanium oxide ($SiGeO_x$), and combinations thereof. In some embodiments, gate dielectric layers 112B and 108B can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), and combinations thereof. The high-k dielectric material can have a dielectric constant that is greater than about 3.9. Gate dielectric layers 112B and 108B can have a thickness between about 1 nm and about 10 nm.

Gate structures 112 and nanostructured gate layers 108 can include gate electrodes 112A and 108A. In some embodiments, gate electrodes 112A and 108A can include a conductive layer disposed on gate dielectric layers 112B and 108B. The conductive layer can have multiple layers (not shown in FIG. 1). Gate electrodes 112A and 108A can include a work function metal (WFM) layer (not shown in FIG. 1) disposed on gate dielectric layers 112B and 108B and a gate metal fill layer (not shown in FIG. 1) disposed on the WFM layer. In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped titanium nitride (TiN), Al-doped tantalum (Ta), Al-doped tantalum nitride (TaN), other suitable Al-based materials, substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu) alloy, and combinations thereof. The WFM layer can have a thickness between about 2 nm and about 20 nm. The gate metal fill layer can include a suitable conductive material, such as tungsten (W), low-fluorine tungsten (LFW), Ti, silver (Ag), ruthenium (Ru), molybdenum (Mo), copper (Cu), cobalt (Co), Al, iridium (Ir), nickel (Ni), metal alloys, and combinations thereof. The gate metal fill layer can have a thickness between about 2 nm and about 100 nm.

S/D regions 120 can be disposed on substrate 102 and adjacent to nanostructured gate layers 108 and nanostructured channel layers 104. S/D regions 120 can be a semiconductor material. In some embodiments, S/D regions 120 can have the same semiconductor material as substrate 102 and nanostructured channel layers 104. For example, S/D regions 120 can include Si or SiGe. In some embodiments, S/D regions 120 can be an epitaxial Si or SiGe. In some embodiments, S/D regions 120 can have the same crystalline orientation as that of substrate 102 and nanostructured channel layers 104. S/D regions 120 can be doped with p-type dopants, such as B and other suitable p-type dopants. S/D regions 120 can be doped with n-type dopants, such as P and other suitable n-type dopants. In some embodiments, S/D regions 120 can be doped with the same dopant as substrate 102. A dopant concentration of S/D regions 120 can be in a range from about $1 \times 10^{20}$ atoms/$cm^3$ to about $3 \times 10^{22}$ atoms/cm$^3$. In some embodiments, S/D regions 120 can have a higher dopant concentration than that of substrate 102. For example, S/D regions 120 can have a dopant concentration that is between about 10 times and about 100 times higher than that of substrate 102. S/D regions 120 can have a thickness H5 between about 30 nm and about 60 nm, between about 20 nm and about 80 nm, and between about 10 nm and about 100 nm.

Inner spacers 106 can be interposed between nanostructured gate layers 108 and S/D regions 120. Spacers 110 can be interposed between gate structures 112 and S/D contact structures 124. ESLs 114 can be disposed on gate structures 112. ILD layers 116 can be disposed on ESLs 114. Inner spacers 106, spacers 110, ESLs 114, and ILD layers 116 can include an insulating material, such as SiO$_x$, SiN, SiCN, SiOCN, SiGeO$_x$, and combinations thereof. Inner spacers 106 can have a thickness between about 1 nm and about 10 nm. Spacers 110 can have a thickness between about 1 nm and about 20 nm. ESLs 114 can have a thickness between about 1 nm and about 20 nm. ILD layers 116 can have a thickness between about 5 nm and about 500 nm.

Hardmask layer 128 can be disposed on a bottom surface of substrate 102. Hardmask layer 128 can include an insulating material, such as silicon carbon oxide (SiCO), SiO$_x$, SiN, SiCN, SiOCN, SiGeO$_x$, and combinations thereof. Hardmask layer 128 can have a thickness H7 between about 20 nm and about 50 nm, between about 15 nm and about 80 nm, and between about 10 nm and about 100 nm.

MEOL and BEOL structures 118 can be disposed on S/D contact structures 124 and ILD layers 116. MEOL and BEOL structures 118 can include multiple layers (not shown in FIG. 1) of interconnect structures. Each interconnect structure can include an inter-metal dielectric (IMD) layer (not shown in FIG. 1) and metal vias (not shown in FIG. 1) and metal lines (not shown in FIG. 1) embedded within the IMD layer. MEOL and BEOL structures 118 can electrically couple to S/D contact structures 124 and gate contact structures (not shown in FIG. 1). MEOL and BEOL structures 118 can have a thickness between about 50 nm and about 5000 μm.

Top silicide layers 122 can be disposed within a top portion of S/D regions 120. In some embodiments, top silicide layers 122 can occupy an entire top surface of S/D regions 120. In some embodiments, top silicide layers 122 can occupy a top surface of S/D regions 120 that is substantially similar to a bottom surface of S/D contact structures 124. In some embodiments, top silicide layers 122 can have a substantially flat top surface and a substantially flat bottom surface. Bottom silicide layers 132 can be disposed within a bottom portion of S/D regions 120. In some embodiments, bottom silicide layers 132 can occupy an entire bottom surface of S/D regions 120. In some embodiments, bottom silicide layers 132 can occupy a bottom surface of S/D regions 120 that is substantially similar to a top surface of metal capping layers 134 or a top surface of metal fill layers 136. In some embodiments, bottom silicide layers 132 can have a curved top surface, a curved bottom surface, or both a curved top surface and a curved bottom surface.

Top silicide layers 122 and bottom silicide layers 132 can include titanium silicide (TiSi), cobalt silicide (CoSi), nickel silicide (NiSi), ruthenium silicide (RuSi), molybdenum silicide (MoSi), tungsten silicide (WSi), or combinations thereof. Top silicide layers 122 can have a thickness H8 between about 5 nm and about 20 nm, between about 3 nm and about 25 nm, and between about 1 nm and about 30 nm. Bottom silicide layers 132 can have a thickness H3 between about 5 nm and about 10 nm, between about 3 nm and about 15 nm, and between about 1 nm and about 20 nm. If thickness H3 is greater than about 20 nm, bottom silicide layers 132 can take up too much space of S/D regions 120 and the total number of carriers can be reduced. If thickness H3 is less than about 1 nm, the resistance of buried conductive structures 138 can be too great. The resistance of buried conductive structures 138 can be too great if the resistance of buried conductive structures 138 is greater than about 500 Ohm (Ω).

Metal capping layers 134 can be disposed on a bottom surface of bottom silicide layers 132. In some embodiments, metal capping layers 134 can have a curved top surface, a curved bottom surface, or both a curved top surface and a curved bottom surface. In some embodiments, a top surface of metal capping layers 134 can be above a top surface of substrate 102. Metal capping layers 134 can include a conductive material, such as W, Mo, or combinations thereof. Metal capping layers 134 can have a thickness H2 between about 5 nm and about 10 nm, between about 3 nm and about 15 nm, and between about 1 nm and about 20 nm. A ratio H2/H3 between thickness H2 and thickness H3 can be between about 0.7 and about 0.8, between about 0.6 and about 0.9, and between about 0.5 and about 1. If thickness H2 is greater than about 20 nm, or if the ratio H2/H3 is greater than about 1, metal capping layers 134 can take up too much space of S/D regions 120 and the total number of carriers can be reduced. If thickness H2 is less than about 1 nm, or if the ratio H2/H3 is less than about 0.5, metal capping layers 134 cannot effectively prevent oxidation of bottom silicide layers 132. Metal capping layers 134 cannot effectively prevent oxidation of bottom silicide layers 132 if more than about 80% of bottom silicide layers 132 is oxidized.

S/D contact structure liners 126 can be disposed on a top surface of top silicide layers 122. An outer sidewall of S/D contact structure liners 126 can be in contact with ILD layers 116, ESLs 114, and spacers 110. An inner sidewall of S/D contact structure liners 126 can be in contact with S/D contact structures 124. A bottom surface of S/D contact structure liners 126 can be in contact with top silicide layers 122. Buried conductive structure liners 130 can be disposed on a bottom surface of bottom silicide layers 132. An outer sidewall of buried conductive structure liners 130 can be in contact with substrate 102 and hardmask layer 128. An inner sidewall of buried conductive structure liners 130 can be in contact with metal fill layers 136 and metal capping layers 134. A top surface of buried conductive structure liners 130 can be in contact with bottom silicide layers 132.

S/D contact structure liners 126 and buried conductive structure liners 130 can include silicon carbide (SiC), SiCO, SiO$_x$, SiN, SiCN, SiOCN, SiGeO$_x$, lanthanum oxide (La$_2$O$_3$), aluminum oxide (Al$_2$O$_3$), aluminum oxygen nitride (AlON), ZrO$_2$, HfO$_2$, zinc oxide (ZnO), zirconium nitride (ZrN), zirconium aluminum oxide (ZrAlO), TiO$_2$, Ta$_2$O$_3$, yttrium oxide (YO), tantalum carbon nitride (TaCN), zirconium silicon (ZrSi), HfZrO, HfSiO$_4$, zirconium silicate (ZrSiO$_2$), and combinations thereof. S/D contact structure liners 126 and buried conductive structure liners 130 can have a width W1 between about 3 nm and about 6 nm, between about 2 nm and about 8 nm, and between about 1 nm and about 10 nm. In some embodiments, semiconductor device 100 may not include S/D contact structure liners 126 and/or buried conductive structure liners 130.

S/D contact structures 124 can be disposed on a top surface of top silicide layers 122. In some embodiments, S/D contact structures 124 can have a substantially flat bottom surface. Metal fill layers 136 can be disposed on a bottom surface of metal capping layers 134. In some embodiments, metal fill layers 136 can have a curved top surface and a substantially flat bottom surface. Metal fill layers 136 can traverse through substrate 102 and hardmask layer 128. In some embodiments, a top surface of metal fill layers 136 can be below a top surface of substrate 102. In some embodiments, metal fill layers 136 can be substantially aligned to S/D contact structures 124 in a first direction, such as the x-direction. In some embodiments, metal fill layers 136 can be substantially aligned to S/D contact structures 124 in a second direction, such as the y-direction. S/D contact structures 124 and metal fill layers 136 can include a conductive material, such as Co, W, Ru, Al, Mo, Ti, Cu, or combinations thereof. In some embodiments, metal fill layers 136 can have the same conductive material as that of metal capping layers 134. In some embodiments, metal fill layers 136 can have different conductive materials from that of metal capping layers 134.

S/D contact structures 124 can have a width W3 between about 20 nm and about 60 nm, between about 15 nm and about 80 nm, and between about 10 nm and about 100 nm. In some embodiments, S/D contact structures 124 can have a top width greater than a bottom width. S/D contact structures 124 can have a thickness H6 between about 10 nm and about 50 nm, between about 8 nm and about 80 nm, and between about 5 nm and about 100 nm. Metal fill layers 136 can have a width W2 around its bottom surface between about 10 nm and about 30 nm, between about 8 nm and about 40 nm, and between about 5 nm and about 50 nm. Metal fill layers 136 can have a width W4 around its top surface between about 8 nm and about 28 nm, between about 7 nm and about 38 nm, and between about 5 nm and about 48 nm. In some embodiments, metal fill layers 136 can have a bottom width greater than a top width. Metal fill layers 136 can have a thickness H1 between about 15 nm and about 45 nm, between about 8 nm and about 70 nm, and between about 5 nm and about 100 nm. A ratio H1/H2 between thickness H1 and thickness H2 can be between about 3 and about 5, between about 2 and about 8, and between about 1 and about 10. If the ratio H1/H2 is less than about 1, metal capping layers 134 can take up too much space of S/D regions 120 and the total number of carriers can be reduced. If the ratio H1/H2 is greater than about 10, metal capping layers 134 cannot effectively prevent oxidation of bottom silicide layers 132. Metal capping layers 134 cannot effectively prevent oxidation of bottom silicide layers 132 if more than about 80% of bottom silicide layers 132 is oxidized.

Figure 2:
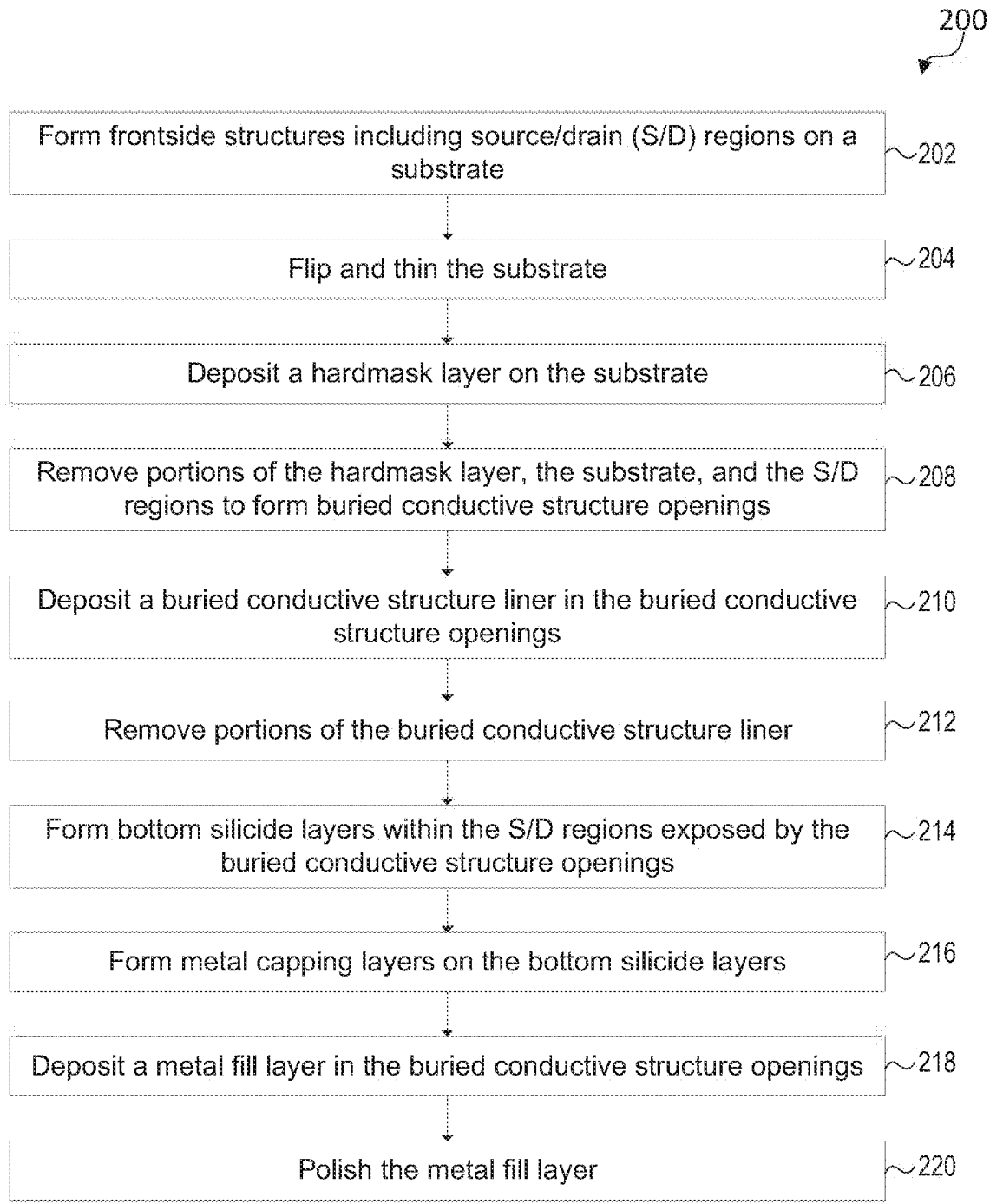
FIG. 2 is a flow diagram of a method for fabricating a semiconductor device with buried conductive structures in a substrate, in accordance with some embodiments.

FIG. 2 is a flow diagram of a method 200 for fabricating semiconductor device 100 with buried conductive structures 138 as shown in FIG. 1, according to some embodiments. For illustrative purposes, the operations illustrated in FIG. 2 will be described with reference to the example fabrication process for fabricating semiconductor device 100 as illustrated in FIGS. 3-12. FIGS. 3-12 are cross-sectional views of semiconductor device 100 at various stages of fabrication, according to some embodiments. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. Elements in FIGS. 3-12 with the same annotations as the elements in FIG. 1 are described above. It should be noted that method 200 may not produce a complete semiconductor device 100. Accordingly, it is understood that additional processes can be provided before, during, and after method 200, and that some other processes may only be briefly described herein.

Figure 3:
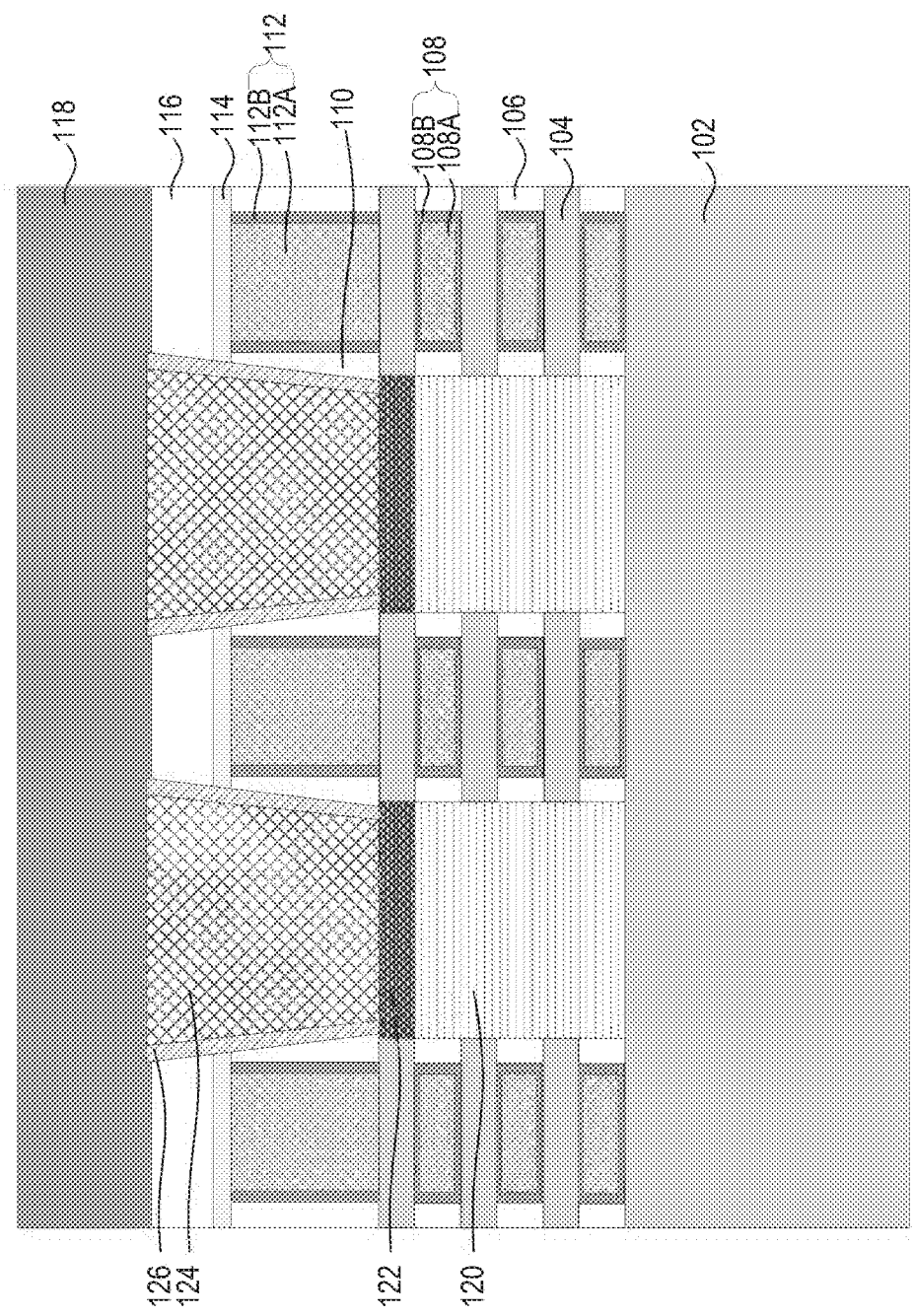
FIGS. 3-12 illustrate cross-sectional views of a semiconductor device with buried conductive structures in a substrate at various stages of its fabrication process, in accordance with some embodiments.

Referring to FIG. 2, in operation 202, frontside structures including S/D regions are formed on a substrate. For example, as shown in FIG. 3, frontside structures including S/D regions 120 can be formed on substrate 102. A superlattice structure can be formed on substrate 102. The superlattice structure can include multiple nanostructured SiGe layers (not shown in FIG. 3) epitaxially grown on substrate 102 and multiple nanostructured channel layers 104 epitaxially grown on the multiple nanostructured SiGe layers. The superlattice structure can be patterned by a photolithography patterning process or a double patterning process. Polysilicon can be blanket deposited over the patterned superlattice structures by a CVD process. The polysilicon can be patterned by a photolithography patterning process to form polysilicon structures (not shown in FIG. 3). The polysilicon structures can be formed on a first portion of the patterned superlattice structures. Spacers 110 can be deposited on the polysilicon structures by a CVD process or a physical vapor deposition (PVD) process. A second portion of the patterned superlattice structures can be removed by a dry etch process or a wet etch process to form S/D region openings. End portions of the nanostructured SiGe layers can be removed by a dry etch process to form inner spacer openings. Inner spacers 106 can be deposited in the inner spacer openings by a CVD process or a PVD process.

S/D regions 120 can be epitaxially grown in the S/D region openings. By way of example and not limitation, S/D regions 120 can be epitaxially grown using source gases, such as silane ($SiH_4$), silicon tetrachloride ($SiCl_4$), trichlorosilane (TCS), and dichlorosilane ($SiH_2Cl_2$ and DSC). Hydrogen ($H_2$) can be used as a reactant gas to reduce the aforementioned source gases. For example, $H_2$ can combine with Cl to form hydrogen chloride (HCl), leaving Si to epitaxially grow in S/D regions 120. The growth temperature during the epitaxial growth can range from about 700° C. to about 1250° C. depending on the gases used. In some embodiments, substrate 102 can act as a seed layer for S/D regions 120. S/D regions 120 can be in-situ doped during their epitaxial growth process using p-type dopants, such as B, In, and Ga, or n-type dopants, such as P and As. For p-type in-situ doping, p-type doping precursors, such as diborane ($B_2H$), boron trifluoride ($BF_3$), and other p-type doping precursors can be used. For n-type in-situ doping, n-type doping precursors, such as phosphine ($PH_3$), arsine ($AsH_3$), and other n-type doping precursor can be used.

The polysilicon structures can be removed by a dry etch process to form gate structure openings. The nanostructured SiGe layers can be removed by a dry etch process to form gate layer openings. Gate dielectric layers 112B and 108B can be deposited in the gate structure openings and the gate layer openings by a plasma-enhanced chemical vapor deposition (PECVD) process, a CVD process, a PVD process, or an ALD process. WFM layers (not shown in FIG. 3) can be deposited on gate dielectric layers 112B and 108B by a PECVD process, a CVD process, a PVD process, an ALD process, or a metal organic chemical vapor deposition (MOCVD) process. Gate metal fill layers (not shown in FIG. 3) can be deposited on the WFM layers by a PECVD process, a CVD process, a PVD process, an ALD process, a MOCVD process, or a sputtering process. After the polysilicon structures are replaced with gate structures 112 and the nanostructured SiGe layers are replaced with nanostructured gate layers 108, ESLs 114 can be deposited on gate structures 112 by a CVD process. ILD layers 116 can be deposited on ESLs 114 by a CVD process or a PVD process.

Portions of ILD layers 116 and ESLs 114 can be removed by a dry etch process to form S/D contact structure openings. Top silicide layers 122 can be formed within a top portion of S/D regions 120 exposed by the S/D contact structure openings by depositing a metal by a CVD process, a PVD process, or an ALD process followed by a thermal anneal process. In some embodiments, top silicide layers 116 can be formed by an ion implantation process using a metal as the implantation species. S/D contact structure liners 126 can be deposited in the SMD contact structure openings by a CVD process or an ALD process. S/D contact structures 124 can be deposited in the S/D contact structure openings, on top silicide layers 122, and on S/D contact structure liners 126 by a CVD process, a MOCVD process, a PVD process, a sputtering process, or an electroplating process. In some embodiments, a chemical mechanical planarization (CMP) process can be performed to planarize top surfaces of S/D contact structures 124 and ILD layers 116.

MEOL and BEOL structures 118 can be formed on S/D contact structures 124 and ILD layers 116. Each layer of MEOL and BEOL structures 118 can be formed by: (i) depositing an IMD layer by a PVD process or a CVD process; (ii) forming metal via openings and metal line openings in the IMD layer by a dry etch process or a wet etch process; (iii) forming metal vias and metal lines by depositing a metal in the metal via openings and the metal line openings by a CVD process, a MOCVD process, a PVD process, a sputtering process, or an electroplating process; and (iv) performing a CMP process to planarize top surfaces of the metal vias and the metal lines with the IMD layer.

Figure 4:
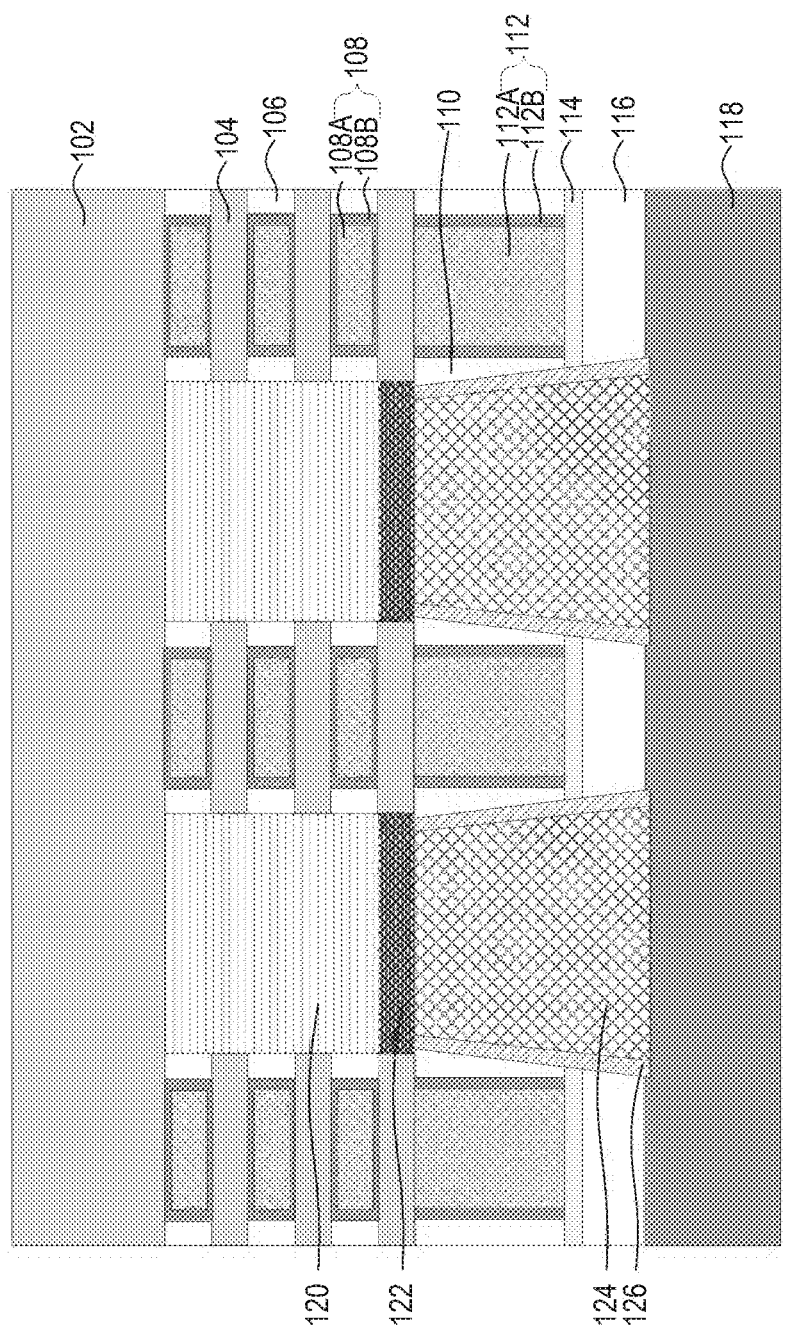

Referring to FIG. 2, in operation 204, the substrate is flipped and thinned. For example, as shown in FIG. 4, substrate 102 can be flipped and thinned. Substrate 102 can be thinned by a mechanical grinding process, a CMP process, a wet etch process, or a dry etch process.

Figure 5:
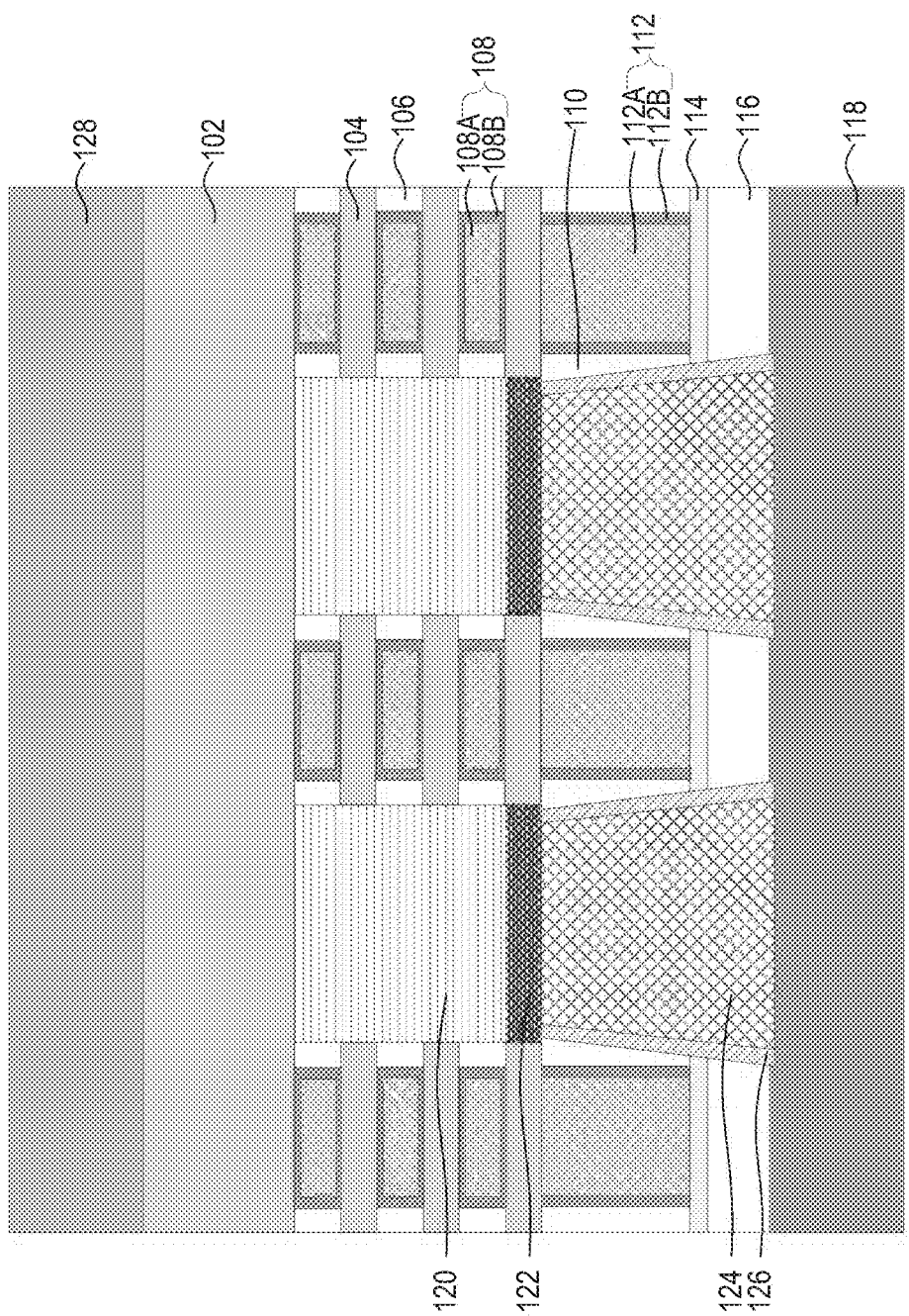

Referring to FIG. 2, in operation 206, a hardmask layer can be deposited on the substrate. For example, as shown in FIG. 5, hardmask layer 128 can be deposited on substrate 102. Hardmask layer 128 can be deposited by a CVD process or a PVD process.

Figure 6:
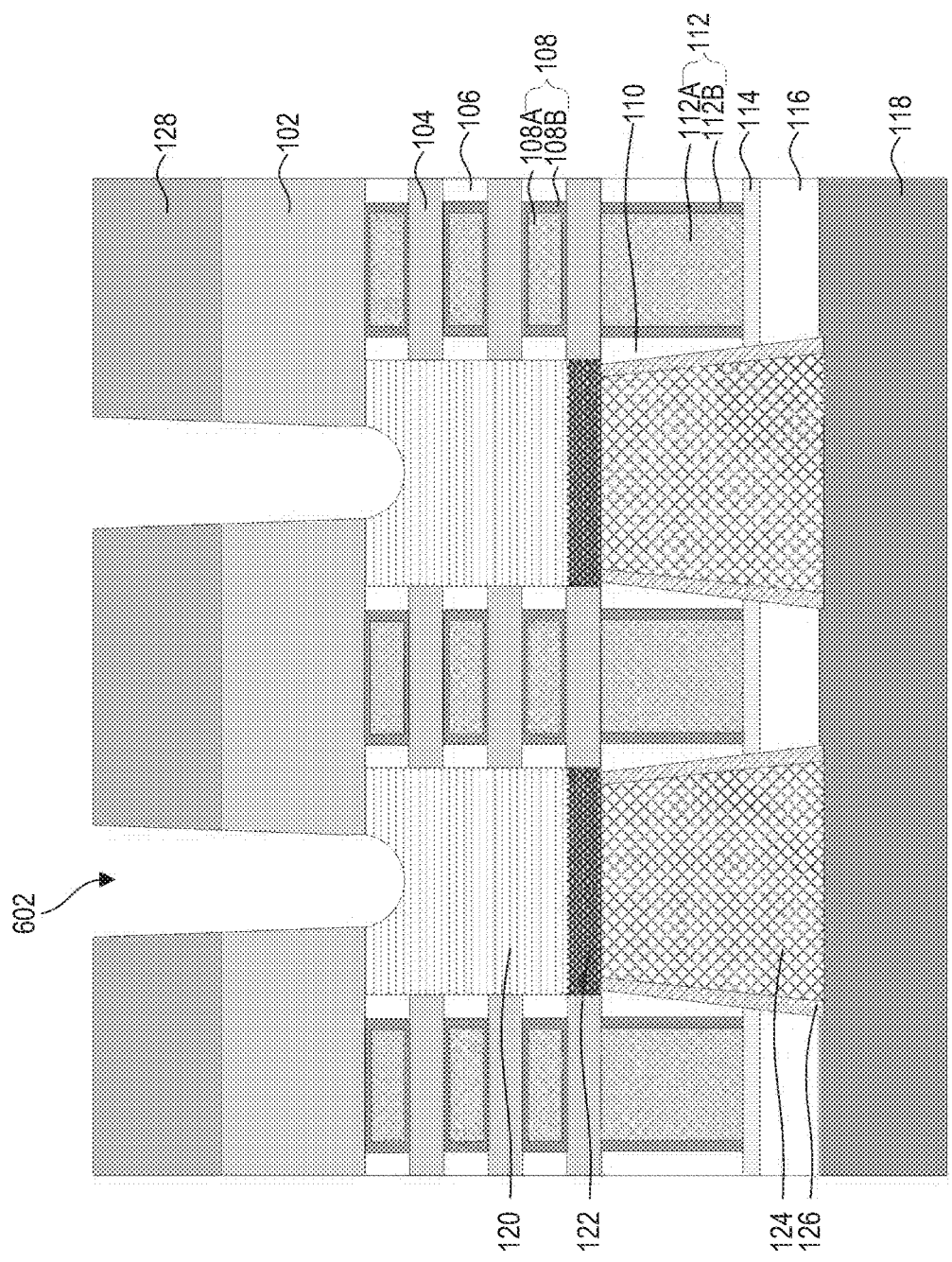

Referring to FIG. 2, in operation 208, portions of the hardmask layer, the substrate, and the S/D regions are removed to form buried conductive structure openings. For example, as shown in FIG. 6, portions of hardmask layer 128, substrate 102, and S/D regions 120 can be removed to form buried conductive structure openings 602. Portions of hardmask layer 128, substrate 102, and S/D regions 120 can be removed by a dry etch process or a wet etch process. In some embodiments, the dry etch process can include etchants with an (i) oxygen-containing gas; (ii) methane ($CH_4$); (iii) a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); (iv) a chlorine-containing gas (e.g., chlorine ($Cl_2$), chloroform ($CHC_3$), carbon tetrachloride ($CCl_4$), and/or boron trichloride ($BC_3$)); (v) a bromine-containing gas (e.g., hydrogen bromide (HBr) and/or bromoform ($CHBr_3$)); (vi) an iodine-containing gas; (vii) other suitable etching gases and/or plasmas; or (viii) combinations thereof. In some embodiments, the wet etch process can include etching in diluted hydrofluoric acid (DHF), potassium hydroxide (KOH) solution, hydrogen peroxide ($H_2O_2$), ammonia ($NH_3$), a solution containing hydrofluoric acid (HF), nitric acid ($HNO_3$), acetic acid ($CH_3COOH$), or combinations thereof. The etch process to form buried conductive structure opening 602 can be a timed etch. In some embodiments, the area to form buried conductive structure opening 602 can be defined by a photoresist layer (not shown in FIG. 6).

Figure 7:
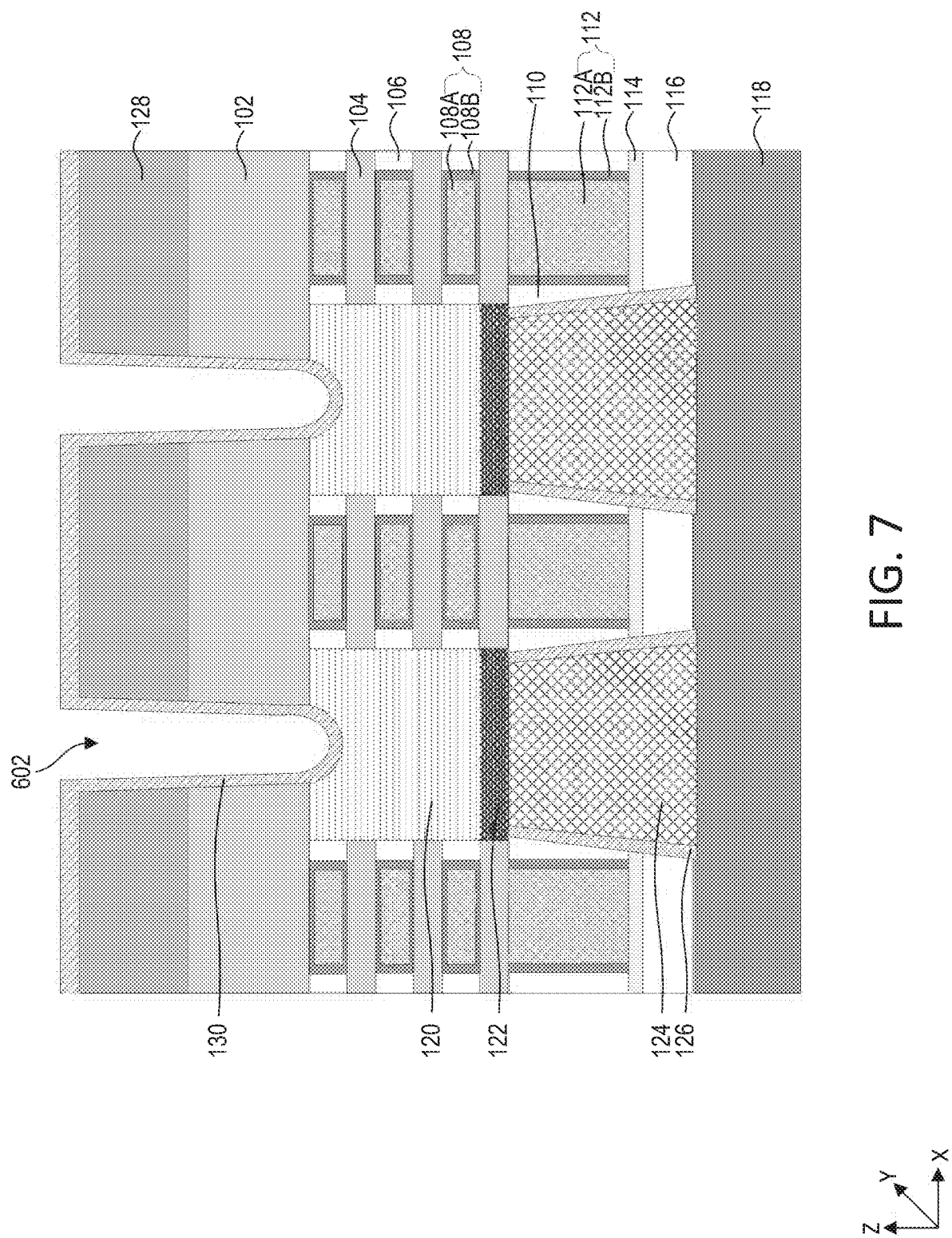

Referring to FIG. 2, in operation 210, a buried conductive structure liner is deposited in the buried conductive structure openings. For example, as shown in FIG. 7, buried conductive structure liner 130 can be deposited in buried conductive structure openings 602. Buried conductive structure liner 130 can be deposited by a CVD process, a PVD process, a PECVD process, or an ALD process.

Figure 8:
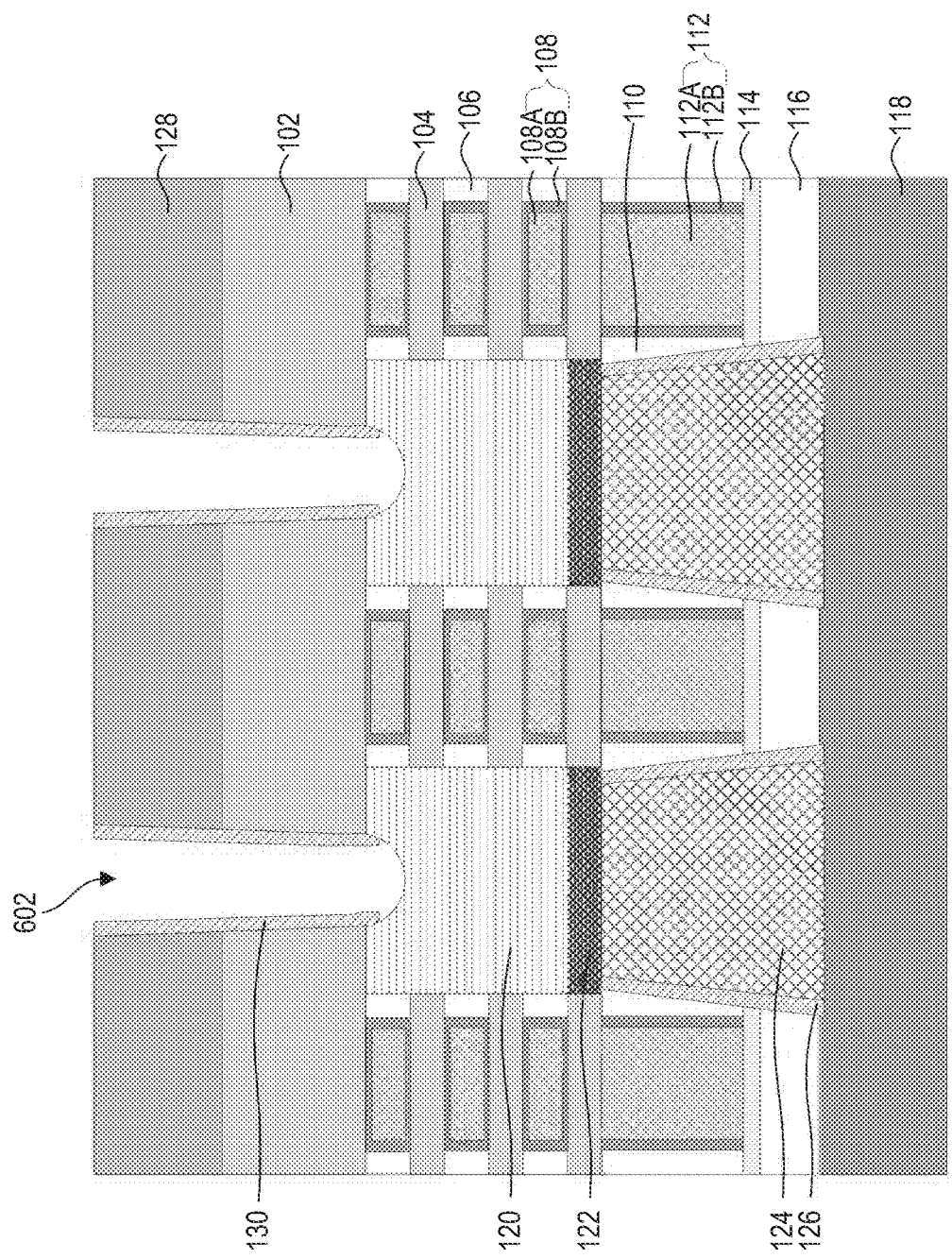

Referring to FIG. 2, in operation 212, portions of the buried conductive structure liner is removed. For example, as shown in FIG. 8, portions of buried conductive structure liner 130 can be removed. Portions of buried conductive structure liner 130 above top surfaces of hardmask layer 128 and on S/D regions 120 can be removed by a dry etch process. The dry etch process can be a directional etch process that removes buried conductive structure liner 130 at a greater rate in a horizontal direction, such as in the x-direction and in the y-direction, than in a vertical direction, such as in the z-direction. In some embodiments, a ratio between an etching rate in the horizontal direction and an etching rate in the vertical direction can be between about 2 and about 100.

Figure 9:
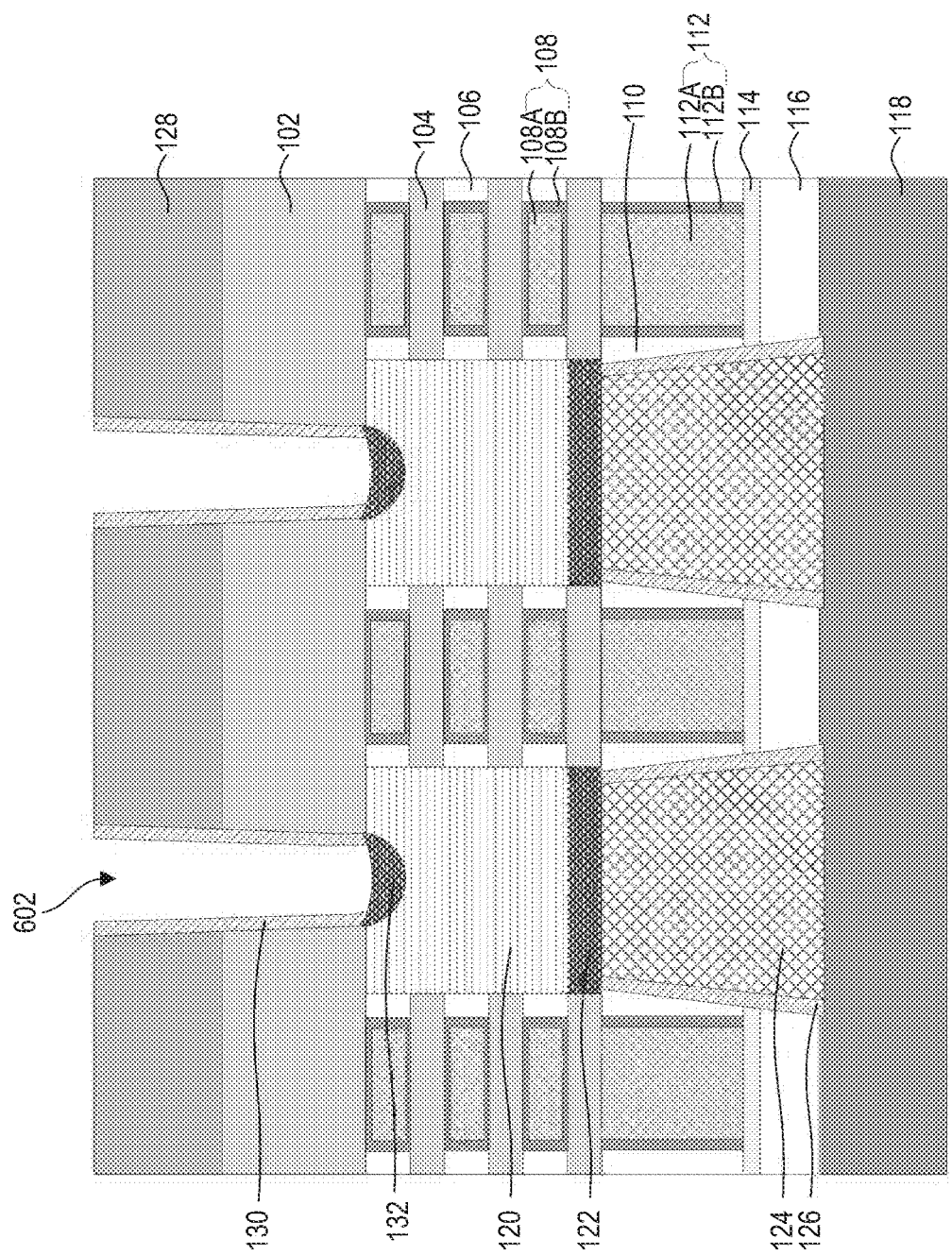

Referring to FIG. 2, in operation 214, bottom silicide layers are formed within the S/D regions exposed by the buried conductive structure openings. For example, as shown in FIG. 9, bottom silicide layers 132 can be formed within S/D regions 120 exposed by buried conductive structure openings 602. Bottom silicide layers 132 can be formed within a bottom portion of S/D regions 120 exposed by buried conductive structure openings 602 by depositing a metal by a CVD process, a PVD process, or an ALD process followed by a thermal anneal process. In some embodiments, bottom silicide layers 132 can be formed by an ion implantation process using a metal as the implantation species.

Figure 10:
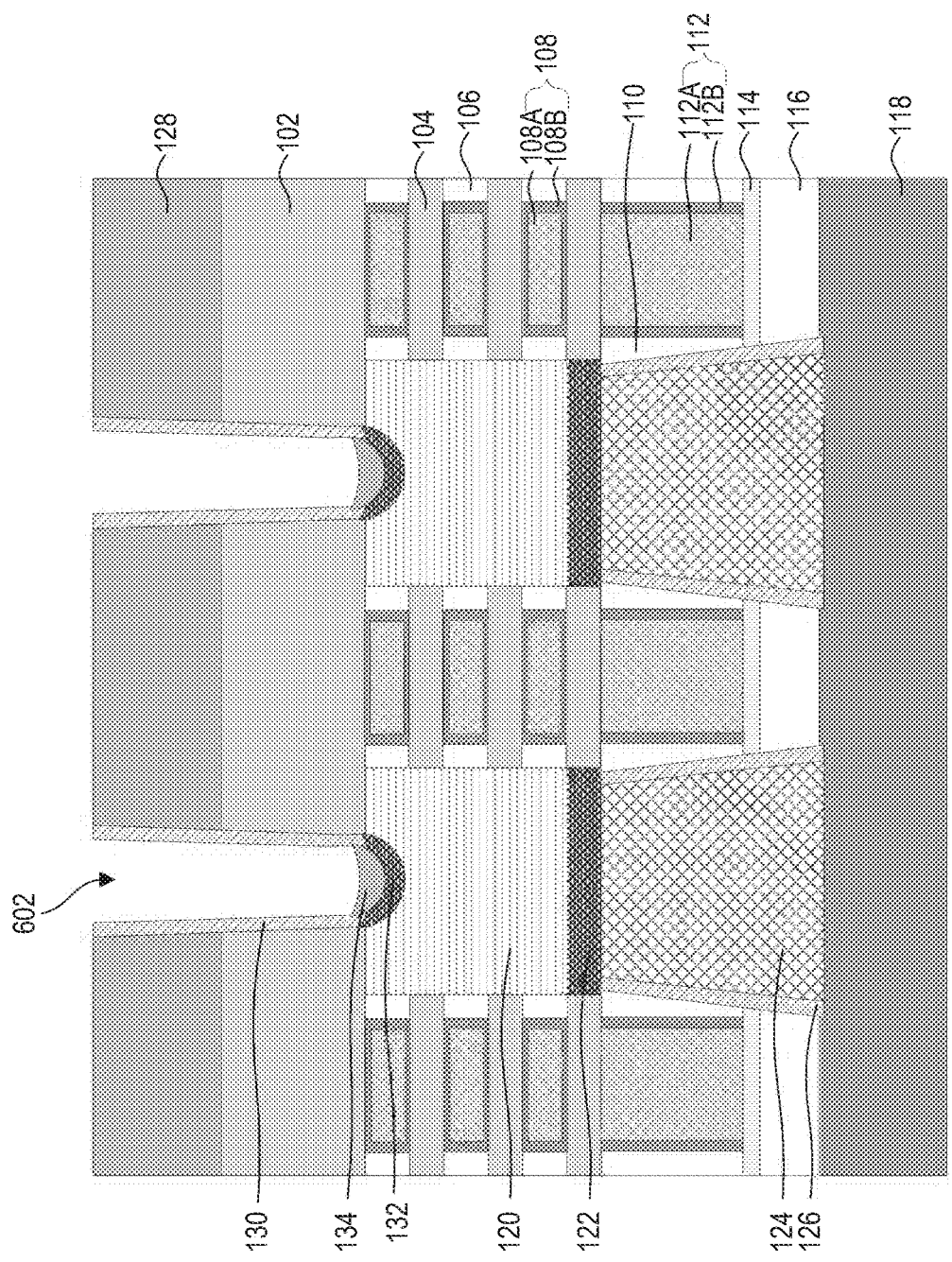

Referring to FIG. 2, in operation 216, metal capping layers are formed on the bottom silicide layers. For example, as shown in FIG. 10, metal capping layers 134 can be formed on bottom silicide layers 132. Metal capping layers 134 can be formed by a CVD process or an ALD process. By way of example and not limitation, metal capping layers 134 can be deposited using source gases, such as tungsten chloride ($WCl_x$) or molybdenum chloride ($MoCl_x$). $H_2$ can be used as a reactant gas to reduce the aforementioned source gases. For example, $H_2$ can combine with Cl to form HCl, leaving W or Mo to be deposited on bottom silicide layers 132. The growth temperature for the deposition can range from about 200° C. to about 300° C., from about 150° C. to about 400° C., and from about 100° C. to about 500° C. depending on the gases used. The pressure in the deposition chamber can range from about 5 Torr to about 50 Torr, from about 1 Torr to about 75 Torr, and from about 0.1 Torr to about 100 Torr depending on the gases used. If the pressure is greater than about 100 Torr, or if the temperature is greater than about 500° C., metal capping layers 134 can take up too much space of S/D regions 120 and the total number of carriers can be reduced. If the pressure is less than about 0.1 Torr, or if the temperature is less than about 100° C., metal capping layers 134 cannot effectively prevent oxidation of bottom silicide layers 132. Metal capping layers 134 cannot effectively prevent oxidation of bottom silicide layers 132 if more than about 80% of bottom silicide layers 132 is oxidized.

Metal capping layers 134 can be selectively formed on metal surfaces and not formed on dielectric surfaces. For example, metal capping layers 134 can be selectively formed on bottom silicide layers 132 and not formed on the sidewalls of buried conductive structure liners 130. Because metal capping layers 134 are deposited on bottom silicide layers 132, there can be no conversion of bottom silicide layers 132. Because metal capping layers 134 are formed without a plasma process, there can also be no bombardment that can remove portions of bottom silicide layers 132. Consequently, bottom silicide layers 132 can retain their thickness. Because the thickness of bottom silicide layers 132 is retained, the resistance of buried conductive structures 138 can be low and the performance of semiconductor device 100 can be increased.

Figure 11:
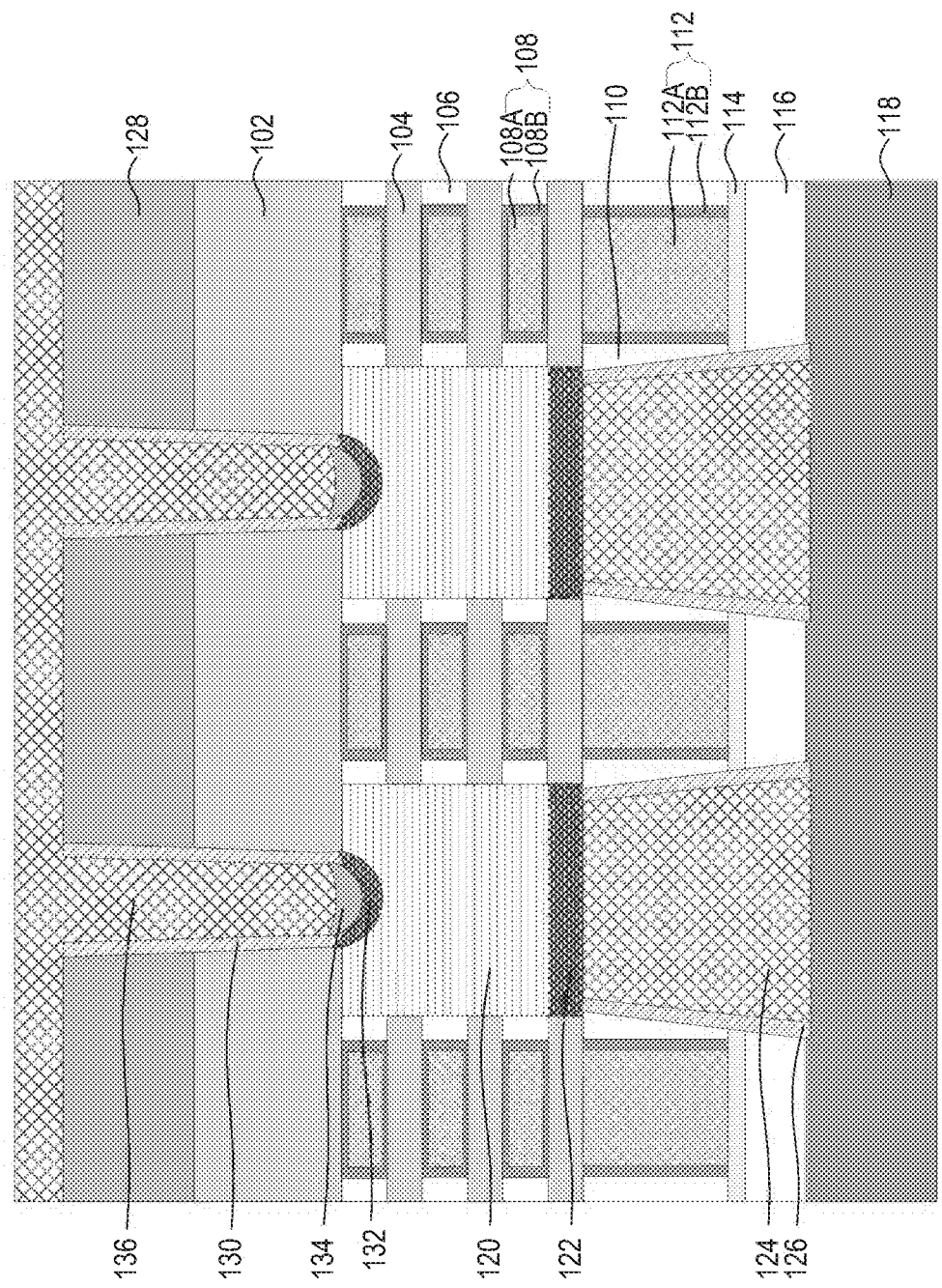

Referring to FIG. 2, in operation 218, a metal fill layer is deposited in the buried conductive structure openings 602. For example, as shown in FIG. 11, metal fill layer 136 can be deposited in buried conductive structure openings 602. In some embodiments, metal fill layer 136 can be deposited by a CVD process. By way of example and not limitation, metal fill layer 136 can be deposited using source gases, such as tungsten fluoride ($WF_x$), $WCl_x$, molybdenum fluoride ($MoF_x$), $MoCl_x$, or ruthenium oxide ($RuO_x$). $H_2$ or $NH_3$ can be used as a reactant gas to reduce the aforementioned source gases. For example, $H_2$ can combine with Cl to form HCl, $H_2$ can combine with F to form HF, or $H_2$ can combine with O to form $H_2O$, leaving W, Mo, or Ru to be deposited on metal capping layers 134. The growth temperature for the deposition can range from about 100° C. to about 450° C. depending on the gases used. The pressure in the deposition chamber can range from about 1 mTorr to about 50 Torr depending on the gases used. In some embodiments, metal fill layer 136 can be deposited by an electroplating process. By way of example and not limitation, electroplating mixtures can include cobalt chloride ($CoCl_x$), cobalt sulfur oxide ($CoS_xO_y$), copper chloride ($CuCl_x$), or copper sulfur oxide ($CuS_xO_y$). The electroplating mixtures can include solutions such as para-dimethylaminobenzaldehyde (DMBA), ammonium chloride ($NH_4Cl$), $BO_xH_y$, $CoC_xH_yN_z$, $CH_xO_y$, and combinations thereof. The temperature for the electroplating mixtures can range from about 10° C. to about 70° C. The pH value of the electroplating mixtures can range from about 6 to about 10.

Metal fill layer 136 can be selectively formed on metal surfaces and not formed on dielectric surfaces. For example, metal fill layer 136 can be selectively formed on metal capping layers 134 and not formed on the sidewalls of buried conductive structure liners 130. In some embodiments, metal capping layers 134 can function as seed layers to facilitate the formation of metal fill layer 136 in a bottom-up manner. In some embodiments, metal capping layers 134 can function as glue layers to improve adhesion of metal fill layer 136.

Figure 12:
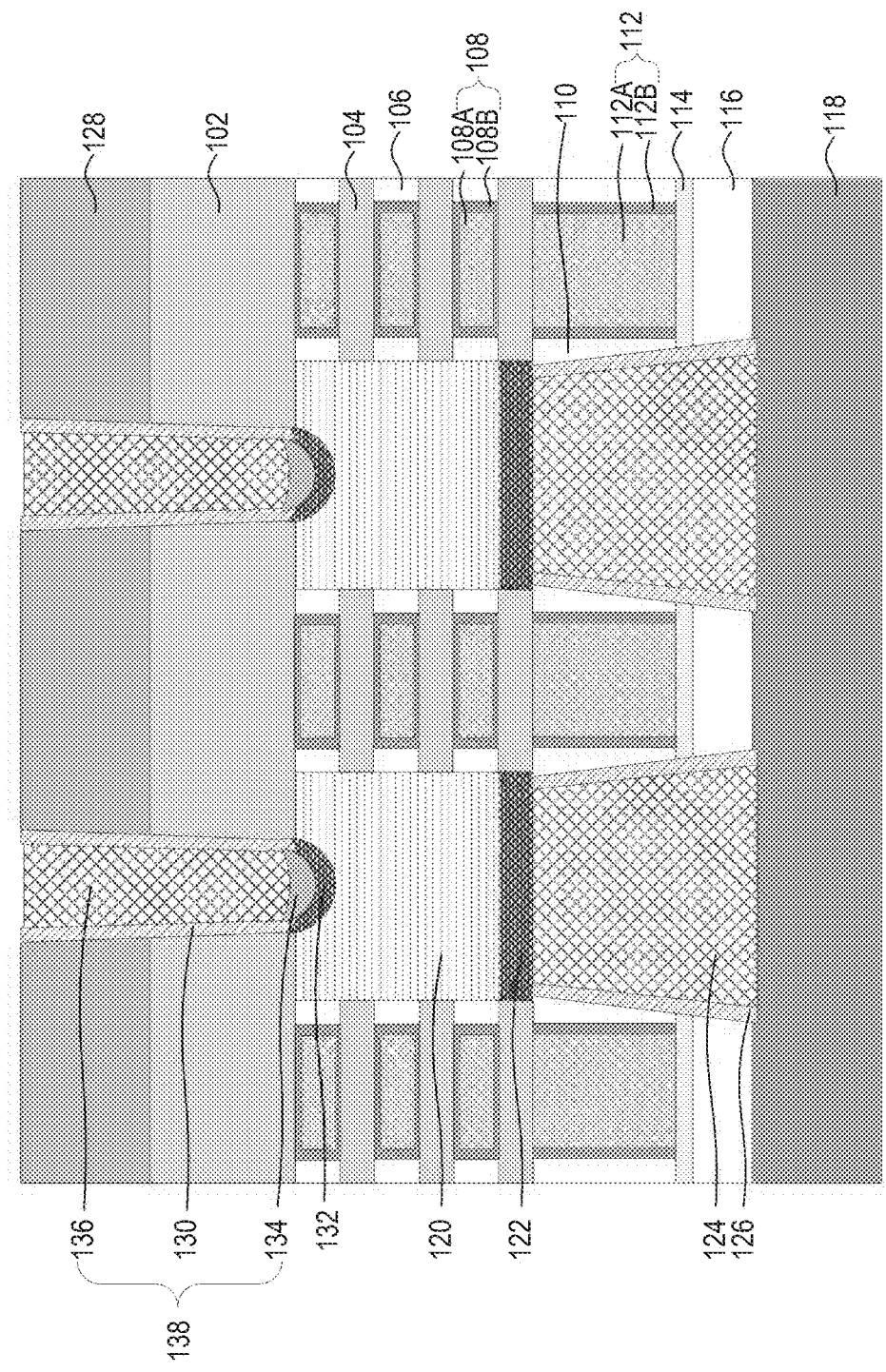

Referring to FIG. 2, in operation 220, the metal fill layer is polished. For example, as shown in FIG. 12, metal fill layer 136 can be polished. Metal fill layer 136 above top surfaces of hardmask layer 128 can be polished by a CMP process. After the CMP process, substrate 102 can be flipped and semiconductor device 100 as shown in FIG. 1 can be formed.

The present disclosure provides an example semiconductor device (e.g., semiconductor device 100) with buried conductive structures (e.g., buried conductive structures 138) with reduced resistance and an example method (e.g., method 200) for fabricating the same. Metal capping layers (e.g., metal capping layers 134) can be formed below the bottom silicide layers (e.g., bottom silicide layers 132) to prevent the bottom silicide layers from being oxidized. Buried conductive structure liners (e.g., buried conductive structure liners 130) and metal fill layers (e.g., metal fill layers 136) can be formed below the metal capping layers. The metal capping layers can be formed by an atomic layer deposition (ALD) process or a chemical vapor deposition (CVD) process. Because the metal capping layers are deposited below the bottom silicide layers, there can be no conversion of the bottom silicide layers. Because the metal capping layers are formed without a plasma process, there can also be no bombardment that can remove portions of the bottom silicide layers. Consequently, the bottom silicide layers can retain their thickness. Because the thickness of the bottom silicide layers is retained, the resistance of the buried conductive structures can be low and the performance of the semiconductor devices can be increased. In some embodiments, the metal capping layers can function as seed layers to facilitate the formation of the metal fill layers in a bottom-up manner. In some embodiments, the metal capping layers can function as glue layers to improve adhesion of the metal fill layers.

In some embodiments, a structure includes an epitaxial region disposed on a substrate and adjacent to a nanostructured gate layer and a nanostructured channel layer, a first silicide layer disposed within a top portion of the epitaxial region, and a first conductive structure disposed on a top surface of the first silicide layer. The structure further includes a second silicide layer disposed within a bottom portion of the epitaxial region and a second conductive structure disposed on a bottom surface of the second silicide layer and traversing through the substrate, where the second conductive structure includes a first metal layer in contact with the second silicide layer and a second metal layer in contact with the first metal layer.

In some embodiments, a structure includes a metal fill layer traversing through a bottom portion of a substrate and a metal capping layer disposed on a top surface of the metal fill layer, where a top surface of the metal capping layer is above a top surface of the substrate. The structure further includes a source/drain (S/D) region disposed on the substrate and including a first silicide layer within a top portion of the S/D region and a second silicide layer within a bottom portion of the S/D region, where a bottom surface of the second silicide layer is in contact with the top surface of the metal capping layer. The structure further includes a S/D contact structure in contact with a top surface of the first silicide layer and a gate structure disposed adjacent to the S/D contact structure.

In some embodiments, a method includes forming an epitaxial region on a substrate, forming a first silicide layer within a top portion of the epitaxial region, and forming a first conductive structure on a top surface of the first silicide layer. The method further includes removing a portion of the substrate and a bottom portion of the epitaxial region to form an opening and forming a second silicide layer within the epitaxial region exposed by the opening. The method further includes forming a second conductive structure in the opening including forming a first metal layer on a bottom surface of the second silicide layer and forming a second metal layer on a bottom surface of the first metal layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
an epitaxial region disposed on a substrate and adjacent to a nanostructured gate layer and a nanostructured channel layer;
a first silicide layer disposed within a top portion of the epitaxial region;
a first conductive structure disposed on a top surface of the first silicide layer;
a second silicide layer disposed within a bottom portion of the epitaxial region; and
a second conductive structure disposed on a bottom surface of the second silicide layer and traversing through the substrate, wherein the second conductive structure comprises:
a first metal layer in contact with the second silicide layer; and
a second metal layer in contact with the first metal layer.

2. The structure of claim 1, further comprising an inner spacer interposed between the epitaxial region and the nanostructured gate layer.

3. The structure of claim 1, further comprising a dielectric layer disposed on a bottom surface of the substrate, wherein the second metal layer traverses through the dielectric layer and a bottom portion of the substrate.

4. The structure of claim 1, wherein the second conductive structure further comprises a liner, and wherein an outer sidewall of the liner is in contact with the substrate, an inner sidewall of the liner is in contact with the first and second metal layers, and a top surface of the liner is in contact with the second silicide layer.

5. The structure of claim 1, wherein the first metal layer comprises tungsten (W), molybdenum (Mo), or combinations thereof, and wherein a thickness of the first metal layer is between about 1 nm and about 20 nm.

6. The structure of claim 1, wherein the second metal layer comprises cobalt (Co), W, ruthenium (Ru), aluminum (Al), Mo, titanium (Ti), copper (Cu), and combinations thereof, and wherein a thickness of the second metal layer is between about 5 nm and about 100 nm.

7. The structure of claim 1, wherein a ratio between a thickness of the second metal layer and a thickness of the first metal layer is between about 1 and about 10.

8. The structure of claim 1, wherein the second silicide layer comprises titanium silicide (TiSi), cobalt silicide (CoSi), nickel silicide (NiSi), ruthenium silicide (RuSi), molybdenum silicide (MoSi), tungsten silicide (WSi), or combinations thereof, and wherein a thickness of the second silicide layer is between about 1 nm and about 10 nm.

9. The structure of claim 1, wherein a ratio between a thickness of the second silicide layer and a thickness of the first metal layer is between about 0.5 and about 1.

10. The structure of claim 1, further comprising:
a gate structure disposed on the nanostructured channel layer; and
a spacer interposed between the gate structure and the first conductive structure.

11. A structure, comprising:
a metal fill layer traversing through a bottom portion of a substrate;
a metal capping layer disposed on a top surface of the metal fill layer, wherein a top surface of the metal capping layer is above a top surface of the substrate;
a source/drain (S/D) region disposed on the substrate and comprising a first silicide layer within a top portion of the S/D region and a second silicide layer within a bottom portion of the S/D region, wherein a bottom surface of the second silicide layer is in contact with the top surface of the metal capping layer;
a S/D contact structure in contact with a top surface of the first silicide layer; and
a gate structure disposed adjacent to the S/D contact structure.

12. The structure of claim 11, further comprising:
a nanostructured gate layer and a nanostructured channel layer interposed between the substrate and the gate structure;
an inner spacer interposed between the S/D region and the nanostructured gate layer; and
a spacer interposed between the gate structure and the S/D contact structure.

13. The structure of claim 11, further comprising a liner, wherein an outer sidewall of the liner is in contact with the substrate, an inner sidewall of the liner is in contact with the metal fill layer and the metal capping layer, and a top surface of the liner is in contact with the second silicide layer.

14. The structure of claim 11, wherein a ratio between a thickness of the metal fill layer and a thickness of the metal capping layer is between about 1 and about 10.

15. The structure of claim 11, wherein a ratio between a thickness of the second silicide layer and a thickness of the metal capping layer is between about 0.5 and about 1.

16. The structure of claim 11, wherein the metal fill layer and the S/D contact structure are substantially aligned.

17. A structure, comprising:
a region disposed on a substrate and adjacent to a nanostructured gate layer and a nanostructured channel layer;
a first silicide layer disposed on the region;
a first conductive structure disposed on the first silicide layer;
a second silicide layer disposed on a bottom portion of the region; and
a second conductive structure disposed on a bottom surface of the second silicide layer and traversing through the substrate.

18. The structure of claim 17, further comprising an inner spacer interposed between the region and the nanostructured gate layer.

19. The structure of claim 17, further comprising a dielectric layer disposed on a bottom surface of the substrate, a first metal layer in contact with the second silicide layer, and a second metal layer in contact with the first metal layer wherein the second metal layer traverses through the dielectric layer and a bottom portion of the substrate.

20. The structure of claim 19, wherein the first metal layer comprises tungsten (W), molybdenum (Mo), or combinations thereof, and wherein a thickness of the first metal layer is between about 1 nm and about 20 nm.

\* \* \* \* \*

UNITED STATES PATENT AND TRADEMARK OFFICE
CERTIFICATE OF CORRECTION

PATENT NO. : 12,272,621 B2
APPLICATION NO. : 17/807476
DATED : April 8, 2025
INVENTOR(S) : Lin et al.

Page 1 of 1

It is certified that error appears in the above-identified patent and that said Letters Patent is hereby corrected as shown below:

In the Specification

In Column 8, Line 46, delete "($B_2H$)," and insert -- ($B_2H_6$), --, therefor.

In Column 9, Line 12, delete "SMD" and insert -- S/D --, therefor.

In Column 9, Line 57, delete "($CHC_3$)," and insert -- ($CHCl_3$), --, therefor.

In Column 9, Line 58, delete "($BC_3$));" and insert -- ($BCl_3$)); --, therefor.

Signed and Sealed this
Twentieth Day of May, 2025

Coke Morgan Stewart
*Acting Director of the United States Patent and Trademark Office*